United States Patent
Reynolds et al.

(10) Patent No.: US 6,183,564 B1
(45) Date of Patent: Feb. 6, 2001

(54) BUFFER CHAMBER FOR INTEGRATING PHYSICAL AND CHEMICAL VAPOR DEPOSITION CHAMBERS TOGETHER IN A PROCESSING SYSTEM

(75) Inventors: Glyn J. Reynolds, Mesa; Joseph T. Hillman, Scottsdale, both of AZ (US)

(73) Assignee: Tokyo Electron Limited, Tokyo (JP)

( * ) Notice: Under 35 U.S.C. 154(b), the term of this patent shall be extended for 0 days.

(21) Appl. No.: 09/190,870

(22) Filed: Nov. 12, 1998

(51) Int. Cl.$^7$ .................................................. C23C 16/00
(52) U.S. Cl. ..................... 118/719; 204/298.35; 156/345
(58) Field of Search .................... 118/719, 715; 156/345; 204/298.23, 298.25, 298.31, 298.35

(56) References Cited

U.S. PATENT DOCUMENTS

| | | |
|---|---|---|
| 4,917,556 | 4/1990 | Stark et al. . |
| 4,951,601 | 8/1990 | Maydan et al. . |
| 4,951,602 | 8/1990 | Kanai . |
| 4,962,726 * | 10/1990 | Matsushita et al. .................. 118/719 |
| 4,981,408 | 1/1991 | Hughes et al. . |
| 4,990,047 | 2/1991 | Wagner et al. . |
| 5,019,234 | 5/1991 | Harper . |
| 5,024,747 | 6/1991 | Tuner et al. . |
| 5,062,758 | 11/1991 | Trillwood . |
| 5,063,031 | 11/1991 | Sato . |
| 5,071,791 | 12/1991 | Inoue et al. . |
| 5,092,728 | 3/1992 | Crabb et al. . |
| 5,092,729 | 3/1992 | Yamazaki et al. . |
| 5,110,248 | 5/1992 | Asano et al. . |
| 5,110,249 | 5/1992 | Norman . |
| 5,231,839 * | 8/1993 | Rijke et al. ............................. 62/55.5 |
| 5,310,410 * | 5/1994 | Begin et al. .......................... 118/719 |
| 5,685,963 * | 11/1997 | Lorimer et al. ....................... 118/715 |
| 5,695,564 * | 12/1997 | Imahashi ............................... 118/719 |
| 5,871,587 * | 2/1999 | Hasegawa ............................. 118/719 |

OTHER PUBLICATIONS

Merrian–Webster's Collegiate Dictionary. "Cryogenic". pp. 280. 10th Ed. (1993).*

* cited by examiner

Primary Examiner—Jeffrie R. Lund
Assistant Examiner—Sylvia R. MacArthur
(74) Attorney, Agent, or Firm—Wood, Herron & Evans, LLP

(57) ABSTRACT

An apparatus for processing a substrate in a processing system having multiple process chambers and a common transfer chamber comprises a process chamber having a process space to receive and process a substrate and a buffer chamber defining a buffer space. The buffer chamber is positioned beneath the process chamber and is configured for interfacing with a transfer chamber of a processing system for receiving a substrate to be processed. A passage is formed between the process and buffer chambers for moving a substrate between the process space and buffer space and a movable substrate stage in the buffer space is operable for moving vertically in said passage between a first position wherein the substrate is positioned in the buffer space and a second position wherein the substrate is positioned within the process space of the process chamber. A sealing mechanism is operable for sealing said passage to isolate the process chamber and a pumping system is coupled to the buffer chamber for purging the buffer space of contaminants which may leak from the process chamber to generally reduce the escape of the contaminants through the buffer chamber and into the common transfer chamber and other process chambers of a multiple chamber system.

45 Claims, 2 Drawing Sheets

BUFFER CHAMBER FOR INTEGRATING PHYSICAL AND CHEMICAL VAPOR DEPOSITION CHAMBERS TOGETHER IN A PROCESSING SYSTEM

FIELD OF THE INVENTION

This invention relates generally to semiconductor processing and more specifically to the integration of physical vapor deposition (PVD) and chemical vapor deposition (CVD) chambers together in a single processing system.

BACKGROUND OF THE INVENTION

In the formation of integrated circuits (ICs) it is often necessary to deposit thin material layers or films, such as films containing metal and metalloid elements, upon the surface of a substrate, such as a semiconductor wafer. One purpose of such thin films is to provide conductive and ohmic contacts for the ICs and to yield conductive or barrier layers between the various devices of an IC. For example, a desired film might be applied to the exposed surface of a contact or via hole in an insulating layer of a substrate, with the film passing through the insulating layer to provide plugs of conductive material for the purpose of making electrical connections across the insulating layer.

One well known process for depositing such films is chemical vapor deposition (CVD), in which a film is deposited on a substrate using chemical reactions between various constituent or reactant gases, referred to generally as process gases. In CVD, process gases are pumped into the process space of a reaction chamber containing a substrate. The gases react in the process space proximate a surface of the substrate, resulting in the deposition of a film of one or more reaction by-products on the surface. Other reaction by-products that do not contribute to the desired film on the exposed substrate surfaces are then pumped away or purged by a vacuum system coupled to the reaction chamber.

One variation of the CVD process, which is also widely utilized in IC fabrication, is a plasma-enhanced CVD process or PECVD process in which one or more of the process gases is ionized in a gas plasma to provide energy to the reaction process. PECVD is desirable for lowering the processing temperatures and the amount of thermal energy that are usually necessary for a proper reaction with standard CVD. In PECVD, electrical energy is delivered to the process gas or gases to form and sustain the plasma, and therefore, less thermal energy is needed for the reaction.

Another well-known IC fabrication process is sputter deposition, which also utilizes an ionized plasma, but relies upon physical deposition rather than a chemical reaction. Sputter deposition is therefore referred to as a physical vapor deposition or PVD process. PVD processes utilize ionized particles of a charged gas plasma to bombard a target of material and dislodge or "sputter" away material particles from the surface of the target. The material particles then deposit on the substrate which is positioned in the processing chamber proximate the target. In sputter deposition, a plasma gas is introduced into a processing chamber under vacuum. The target to be sputtered is supported on an electrically biased base within the processing chamber whereon the target develops an electrical charge or bias. The power supply which sustains the electrical charge on the target also couples electrical energy into the plasma. The electrical energy ionizes the gas particles to form the plasma of ionized particles, and the ionized particles are attracted to the biased target surface, bombarding the surface and sputtering the material particles from the target. The particles of target material then deposit on the substrate to form a material layer.

Material layers will be deposited by both PVD and CVD methods on a single substrate during IC fabrication. Therefore, in the industry, it has become very common to incorporate a PVD process chamber and a CVD process chamber together within a single processing system, along with a variety of other process chambers. In this way, the substrates to be processed may be transferred quickly and efficiently between the various chambers. Such multi-chamber systems are often referred to as cluster tools because they include a cluster of different processing chambers or modules which are utilized together. Such cluster tools also include a common transfer chamber or module which is operable for transferring the various substrates between the various process chambers in a controlled manufacturing sequence. The transfer chamber will usually incorporate a substrate transport device or substrate handler to move substrates back and forth between the transfer chamber and the various processing chambers coupled to the transfer chamber.

While cluster tools have provided an efficient and cost effective means for IC fabrication, they have had some inherent drawbacks. Specifically, the process gases and process by-products from one chamber can migrate to other chambers, where they may act as contaminants to the processes performed in those other chambers. For example, process gases and by-products within a CVD chamber will tend to migrate into a PVD chamber through the common cluster tool transfer chamber when the substrates are moved between the various process chambers. The CVD gases which are commonly used for IC fabrication actually act as contaminants within the PVD chamber and degrade the quality of the PVD films by being trapped within the films or by exposing the deposited films to undesired chemical attack. HCl is a common by-product of some CVD processes, and will have a corrosive effect on a PVD aluminum film, for example.

To integrate PVD and CVD chambers into a single cluster tool, it is necessary to reduce and minimize the flow of residual CVD contaminants from the CVD process chamber to the PVD chamber. One possible solution utilizes a high vacuum or turbomolecular pump which is connected to the CVD process chamber for purging the chamber to a pressure of around $10^{-6}$ Torr prior to transferring the substrate out of the CVD chamber. Coupling the turbomolecular pump to the CVD chamber, however, not only increases the cost of the processing tool, but also complicates its construction and maintenance.

Another proposed solution for preventing contaminants is to purge the CVD chamber with one or more reactive gases which render the by-products and residual process gases more volatile so that they may be more readily removed from the vacuum system. However, the additional step of exposing the CVD chamber to the reactive gases slows down the throughput of the processing system and thus increases the overall cost of IC fabrication.

Yet another solution might be to use a separately standing chamber between a process chamber and a system transfer chamber to isolate the process chamber from the transfer chamber. For example, an additional chamber might be positioned in-line horizontally between the transfer chamber and process chamber with isolation valves at either end. The isolation valves will selectively isolate the center chamber from the process chamber and transfer chamber. While isolation could therefore be provided without introducing another reactive gas or installing an expensive turbomolecular pump, such a solution still has several drawbacks. First, the horizontal linear arrangement required will increase the footprint of the processing system. Furthermore, the two isolation valves of the center chamber cannot be opened simultaneously without providing a direct path between the process chamber and transfer chamber and thus severely impairing the function of the center chamber. Therefore, an extra substrate handler will be required within each buffer chamber on the cluster tool, in addition to the substrate handler already existing in the transfer chamber, so that the substrate may be moved to the process chamber when the center chamber is isolated from the transfer chamber. Not only does the extra hardware of an additional substrate handler increase the cost of the cluster tool, but it also reduces its reliability while increasing the complexity of operating the various modules within a controlled manufacturing sequence.

Accordingly, it is an objective of the present invention to reduce contaminants migrating between different chambers of a cluster tool, and specifically to reduce the migration of process and by-product gases from a CVD chamber to a PVD chamber within such a cluster tool.

It is another objective of the present invention to achieve such contaminant reduction between multiple process chambers while maintaining an efficient manufacturing throughput for the processing system.

It is still another objective of the invention to reduce contamination without increasing the overall cost, size, and complexity of the cluster tool.

These objectives and other objectives are further discussed hereinbelow and are addressed by the present invention.

SUMMARY OF THE INVENTION

The above-discussed objectives and other objectives are addressed by the present invention which is utilized in a processing system having multiple process chambers and a common transfer chamber which is used to move substrates between the multiple process chambers of the system. An apparatus consistent with the invention comprises a buffer chamber positioned below a particular process chamber. The buffer chamber is configured for interfacing with the transfer chamber of a processing system for receiving a substrate to be processed. The buffer chamber includes a movable substrate stage for moving a substrate vertically between a buffer position within the buffer chamber and a process position within the process chamber.

A sealing mechanism such as a gate valve assembly interfaces between the process chamber and the buffer chamber. The sealing mechanism is closed when a substrate is positioned in the buffer chamber from some other process chamber. In that way, the process chambers are isolated from each other when substrates are moved through the transfer chamber. After the substrate is in position in the buffer chamber and the buffer chamber is isolated from the transfer chamber, the sealing mechanism is opened to allow access to the process chamber above the buffer chamber.

After the substrate is processed, the substrate stage is moved to the buffer position, the gate valve is again closed, and the buffer chamber is purged with a pumping system coupled to the buffer chamber before the substrate is removed through the transfer chamber for further processing. In that way, contaminant migration from the process chamber, into a transfer chamber and then into various other process chambers of a system is reduced. For example, using the invention with a CVD chamber may reduce contaminant migration between the CVD chamber and a PVD chamber sharing a common transfer module or chamber.

More specifically, the invention incorporates a buffer chamber positioned below a process chamber and directly coupled with the process chamber through a common wall and a sealing mechanism which selectively isolates the process chamber from the buffer chamber. Generally, within a processing system utilizing both PVD and CVD chambers, the buffer chamber of the invention will be incorporated with the CVD chamber to prevent migration of CVD gases into the PVD chamber. However, in other configurations, the buffer chamber might be utilized with a PVD chamber to provide an additional layer of vacuum and thus eliminate contaminants, such as water, from entering the PVD chamber. A movable substrate stage is positioned in the buffer space and is configured for receiving a substrate thereon from a transfer chamber.

When the sealing mechanism is open, the substrate stage is operable for moving vertically in the passage between a first position, or buffer position, wherein the substrate is located in the buffer space, and a second position, or process position, wherein the substrate is located within the process space of the process chamber. The substrate stage is further operable for sealing the passage when it moves the substrate to the process position. In that way, the process chamber is isolated from the buffer chamber during processing of the substrate. In a preferred embodiment of the invention, the substrate stage includes first and second actuating mechanisms wherein the first actuating mechanism is operable for moving the stage against the common wall to provide a seal of the passage, and the second actuating mechanism is further movable with respect to the first actuating mechanism to subsequently position the substrate in the process space once the passage is sealed. In that way, a seal of the passage is first made, and then the substrate is further positioned for processing. When the substrate is in the buffer position after processing or being handled by the transfer chamber, the gate valve is closed to isolate the buffer chamber from the process chamber.

The buffer chamber includes a pumping system with high rate pumping and purging capabilities for purging the buffer chamber of contaminants after the substrate has been processed. In one embodiment, the pumping system comprises a high rate vacuum pump in combination with one or more cryogenic panels positioned adjacent a wall of the buffer chamber. The cryogenic panels are operable for adsorbing or cryosorbing and thereby pumping reactive species of a gas from the buffer chamber to reduce contaminants which may migrate to other process chambers. The cryogenic panels are thermally coupled to a source of refrigerant for cooling the panels. Alternatively, an expander head might be provided for rapidly expanding a gas and cooling the panels. The process chamber, such as a CVD chamber, and the substrate stage, which is movable therein, will generally be exposed to high temperatures during processing. Accordingly, the invention incorporates a thermal shield positioned in the buffer chamber between the cryogenic panels and the passage between the process and buffer chambers to absorb radiated thermal energy associated with the process chamber and substrate stage. In addition to, or alternative to, the cryogenic panels, a cryo pump and/or a cryogenic water pump may be utilized for further purging the buffer chamber of contaminants including water.

During processing of the substrate utilizing the present invention, the substrate is transferred to the substrate stage within the buffer space (sealing mechanism closed). The sealing mechanism is then opened and the substrate stage is raised to the process position in the process chamber, providing a seal between the process chamber and the buffer chamber. The substrate is processed and the processing chamber is purged by the vacuum system coupled thereto to remove a substantial amount of the residual gases and by-product gases which may act as contaminants. Next, the substrate stage is lowered to the buffer position and is exposed to a pumping system that further purges the buffer space of contaminants. The gate valve is closed to isolate the process chamber from the buffer chamber being purged. The cryogenic panels or other cryogenic pumping elements utilized in the buffer space further reduce the contaminants which may leak into the transfer chamber and thus into other processing chambers within the processing system.

The buffer chamber is configured for interfacing with a transfer chamber, and an isolation valve is positioned between the transfer chamber and the buffer chamber. The isolation valve is open to move a substrate from the transfer chamber to the buffer chamber. However, the isolation valve is closed to isolate the transfer chamber from the buffer chamber during processing of a substrate and purging of the buffer chamber.

In accordance with another aspect of the present invention, a gas sensing system is coupled to the buffer chamber and is operable for detecting the level of contaminant gases in the buffer space of the buffer chamber. The gas sensing system is operably coupled to the isolation valve to prevent the valve from opening until the buffer space has been sufficiently purged and the contaminant level is sufficiently low. The gas sensing system thus prevents the transfer chamber from being exposed to the buffer chamber until it is properly purged.

The buffer chamber of the present invention is useful within a processing system to reduce contaminants associated with one process chamber to thereby prevent contamination of other process chambers of the system. In accordance with another aspect of the invention, the buffer chamber may be utilized to isolate a process module which includes one or more process chambers. To that end, the buffer chamber is coupled with the process chamber of the module which interfaces with the transfer chamber of the processing system.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION OF THE INVENTION

Figure 1A:
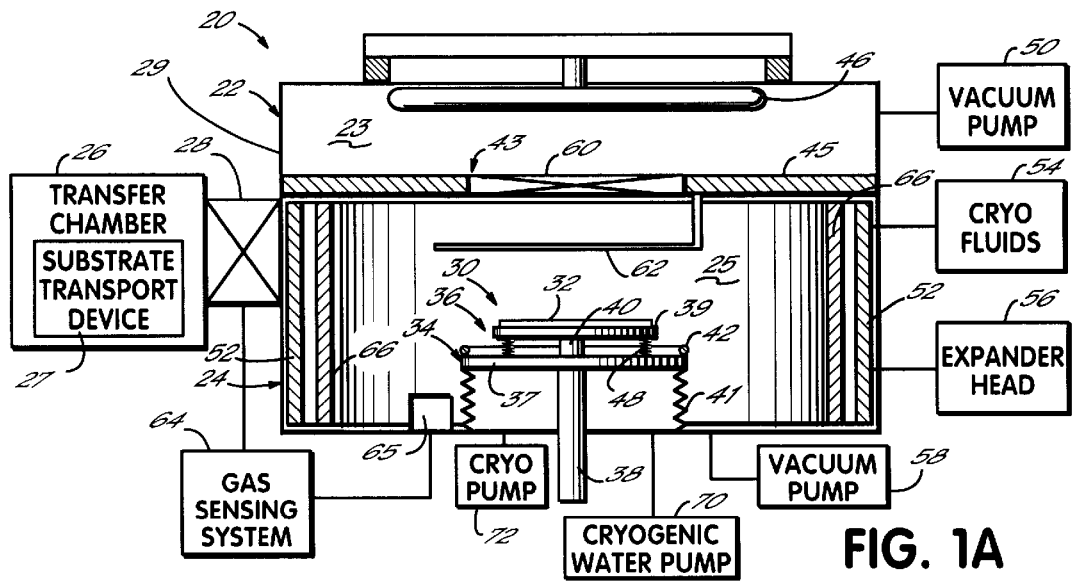
FIG. 1A is a schematic cross-sectional view of an apparatus consistent with the present invention with a substrate in a buffer position.
Figure 1B:
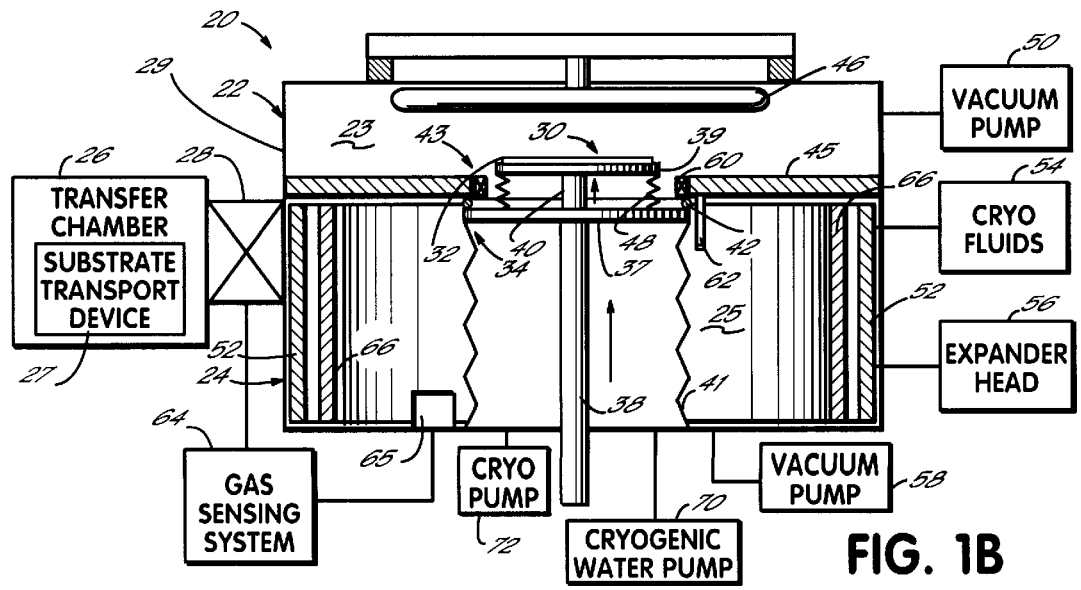
FIG. 1B is a schematic cross-sectional view of an apparatus as in FIG. 1A with a substrate in a process position.

FIGS. 1A and 1B disclose an embodiment of the invention with a substrate resting within a buffer chamber, and the substrate moved from the buffer chamber and into a process chamber, respectively. To that end, apparatus 20 includes a process chamber 22 with a process space 23 therein for receiving a substrate 32. The process chamber 22 could be a CVD chamber, a PVD chamber, or some other process chamber which may generate contaminants which could migrate to other chambers of a multi-chamber processing system. In accordance with the invention, buffer chamber 24 is mounted directly below the process chamber and is configured for interfacing with a transfer chamber 26 of a multi-chamber processing system for receiving substrates to be processed. The transfer chamber 26 includes a suitable substrate transport device 27, which will move one or more substrates into the buffer chamber 24 to be ultimately moved into the process chamber 22 as discussed further hereinbelow. Substrate transport devices are commercially available and may include, for example, a robotic arm which moves the substrates into the buffer chamber. Any suitable such device may be utilized with transfer chamber 26. One such device is shown in U.S. Pat. No. 4,990,047, which is incorporated completely herein by reference. Generally, the transfer chamber 26 will be common to and will interface with other process chambers (not shown in FIGS. 1A, 1B) within a larger processing system. In accordance with one aspect of the present invention, the transfer of contaminants between various process chambers which share a common transfer chamber 26 is reduced.

As mentioned, one suitable substrate transport device 27 might include a robotic arm which moves a substrate from the transfer chamber 26 into the buffer chamber 24 and then retracts so that further processing may occur. An isolation valve 28 is positioned between transfer chamber 26 and the buffer chamber 24 to provide isolation between those respective chambers. Isolation valve 28 opens when the substrate transport device moves into the buffer chamber 24 to introduce a substrate 32 to the buffer chamber 24, and then will close again once the device is retracted. In that way, the transfer chamber 26 and buffer chamber 24 are isolated once the substrate is positioned in the buffer chamber 24 for processing.

The process chamber 22 and buffer chamber 24 may be fabricated in a single housing 29 of stainless steel. A common wall 45 separates the chambers and includes a passage 43 formed by an opening in the wall. Passage 43 facilitates physical communication between the chambers 22, 24 so that a substrate 32 may be moved between the process space 23 and the buffer space 25 of the respective chambers.

For providing isolation between the process chamber 22 and the transfer chamber 26, a sealing mechanism, such as a gate valve assembly 60, is positioned proximate the passage 43 and interfaces with passage 43 to selectively isolate the buffer chamber from the process chamber. After the substrate is processed and removed from the process chamber, the sealing mechanism is closed. The buffer chamber may then be purged of contaminants. The sealing mechanism assembly 60 is closed also to seal the passage 43 whenever the isolation valve 28 is open so that when the substrate 32 is being handled between the transfer chamber 26 and the buffer chamber 24, the process chamber 22 is sealed from the buffer chamber 24.

In the buffer chamber 24, a substrate stage 30 receives substrate 32 thereon through transfer chamber 26. The substrate stage 30 maintains the substrate 32 generally horizontal, as desired. The substrate transport device 27 places the substrate 32 on an actuating mechanism 36 of the stage 30. More specifically, substrate stage 30 includes a first actuating mechanism 34 which moves the substrate stage vertically to position the wafer in the process chamber. A second actuating mechanism 36 moves with respect to the first actuating mechanism 34 and moves a portion of the stage 30 to provide further vertical positioning of the substrate 32 within the process chamber 22. The first actuating mechanism 34 includes a platen 37 which is moved vertically by a shaft 38. The second actuating mechanism 36 includes a second platen 39 which is positioned above platen 37 and is vertically movable on additional shaft 40. Shaft 40 might telescope inside shaft 38, for example. It will be readily understood by a person of ordinary skill in the art that substrate stage 30 might also utilize other mechanisms for moving and positioning the substrate 32 with respect to the process chamber 22. Referring to FIG. 1A, substrate stage 30 is shown in a first, or buffer position, in which the substrate 32 rests in buffer chamber 24. To maintain a vacuum within the buffer chamber 24 and to purge the chamber 24, when desired, stage 30 includes bellows 41 for forming a seal between platen 37 and the bottom wall of chamber 24. Bellows 41 thereby seals shaft 38 and any openings in the buffer chamber 24 through which the shaft 38 moves.

When the buffer chamber is exposed to the transfer chamber, the gate valve assembly 60 is closed to prevent contaminants from migrating from the process chamber 22 through the buffer chamber 24 and into the transfer chamber 26. In that way, the buffer chamber will be interfacing with either the process chamber or the transfer chamber, but not both at the same time. When the substrate is moved by stage 30 to the process chamber, the isolation valve 28 is closed and the gate valve assembly 60 is opened to provide access to the process chamber.

A sealing structure 42, such as an O-ring seal, is coupled to platen 37 to engage the wall 45 around passage 43. Alternatively, the sealing structure 42 may be incorporated into the wall 45 to be engaged by the platen 37. The sealing structure 42 surrounds passage 43 and provides a seal between process chamber 22 and buffer chamber 24 when the substrate 32 and stage 30 are moved to a second position, or process position, wherein the substrate is positioned within a process space 23 defined in the process chamber. Referring to FIG. 1B, stage 30 and substrate 32 are shown moved into the second, or process, position for processing the substrate within the process chamber 22. Vertical movement of shaft 38 moves the stage and moves both platens 37 and 39 toward process chamber 22. The sealing structure 42 of the first actuating mechanism 34 of stage 30 engages the wall 45 around passage 43. The passage is thereby sealed by compression of the sealing structure 42 between the platen 37 and wall 45. The second actuating device 36 of stage 30 is configured and dimensioned to extend through the passage 43 and move further into the process chamber 22 and space 23. Once the stage 30 has sealed passage 43, shaft 40 is then moved vertically to further position the substrate 32, such as with respect to a showerhead 46 that may be used in a CVD process chamber. It will be readily understood by a person of ordinary skill in the art, that process chamber 22 might also be a PVD process chamber and the showerhead 46 might be replaced by a target of material (not shown) to be sputter deposited onto substrate 32. Stage 30 also includes a bellows 48 for the second actuating mechanism for providing a seal between the process space and shaft 40 and any openings in platen 37 or shaft 38 for the shaft 40. Bellows 48 extends between the upper surface of platen 37 and the lower surface of platen 39.

In FIG. 1B, the substrate 32 is in the process space, and the passage 43 is sealed to effectively isolate the process chamber 22 from the buffer chamber 24 during processing.

As noted above, a substrate transport device 27 operates between transfer chamber 26 and buffer chamber 24 to position a substrate 32 on the substrate stage 30 when the gate valve assembly 60 is closed. The isolation valve 28 is then closed and the gate valve assembly 60 is opened. The substrate stage 30 is raised to the second position to raise the substrate into the process space 23. The process is then run, depending upon the operation of chamber 22 and various process parameters. After the process is run, the substrate stage 30 is lowered and the substrate is ready to be moved to another process chamber via transfer chamber 26. However, contaminants from the process space 22, generally in the form of one or more residual or by-product gases, will be present and thus are susceptible to leaking out through the transfer chamber 26 and into another process chamber (not shown) coupled to the transfer chamber 26. To that end, the present invention is operable to isolate the buffer chamber from the process chamber and to remove contaminants from the buffer chamber with a separate pumping/vacuum system coupled to the buffer chamber. The gate valve assembly is used to seal process chamber 22 from the buffer chamber 24 while the buffer chamber is purged. Before the isolation valve 28 is opened to expose the buffer chamber to the transfer chamber, the buffer chamber is sufficiently purged of contaminants. In that way, contaminants leaking into the transfer chamber from the process chamber are reduced and the contamination of adjacent process chambers is also reduced.

The process chamber 22 is coupled to a vacuum system 50 and suitable gas supplies and power supplies (not shown) as necessary for the process to be performed therein. Furthermore, stage 30 might be coupled to a power supply for biasing the substrate 32. For example, for a CVD process, the process chamber 22 will be coupled to a vacuum system which is capable of achieving pressures anywhere from 100 milliTorr up to an atmosphere (1 atm). A PVD process, however, may need a vacuum system which will achieve a lower pressure, such as 1–10 milliTorr. Suitable vacuum systems 50 are commercially available for such processes.

The buffer chamber 24, on the other hand, has high rate pumping capabilities for purging the buffer space of contaminants in accordance with one aspect of the invention. To that end, a pumping system comprises one or more cryogenic panels 52 which are positioned adjacent to or forming part of the walls of the buffer chamber 24. The cryogenic panels 52 provide extremely high pumping speeds for many reactive contaminant gas species which may migrate from the process chamber 22 into the buffer chamber. The panels 52 will preferably have a large area with respect to the buffer space 25 of chamber 24. The panels are continually cooled and continually pump contaminants from space 25 by capturing the contaminant gas particles thereto. Therefore rapid pumping speeds are achieved with respect to the space 25. Such cryogenic panels 52 are generally suitable for pumping contaminants such as water, HCl, and $NH_3$. Cryogenic panels 52 are commercially available, and may be cooled either by coupling the panels to a supply of cryogenic fluids 54, or an expander head 56. With a cryogenic fluid supply 54, the fluids are recirculated through the panels 52 to provide continuous pumping of contaminants by the panels. Suitable cryogenic fluids are liquid nitrogen and/or refrigerants such as Freon. An expander head 56, on the other hand, will rely upon rapid expansion of a substance, such as liquid helium, to cause cooling. The cryogenic panels 52 are generally maintained in a temperature range between 100° and 150° Kelvin.

The panels 52 may not be sufficient to capture all of the contaminant gas species which may leak into buffer chamber 24 before the substrate is to be transported from buffer chamber 24. Therefore, in accordance with another embodiment of the present invention, the buffer chamber pumping system includes a high vacuum pump 58 for removing any additional contaminants not collected by the panels 52. The buffer chamber 24 is thus purged of contaminants before the substrate 32 is moved therefrom and into the transfer chamber 26 by the substrate transport device 27.

In accordance with another aspect of the present invention, a gas sensing system 64 is utilized for detecting the levels of contaminant gas species within buffer chamber 24. Gas sensing system 64 is operably coupled to isolation valve 28, as shown in the Figures, to prevent opening of the isolation valve 28 and transferring of the substrate out of the buffer chamber 24 and into the transfer chamber 26 if a large amount of contaminants still exist within the buffer chamber 24. Gas sensing system 64 may include a suitable sensor 65 which is positioned in the buffer space, such as a commercially available residual gas analyzer (RGA). Gas sensing system 64 might also utilize commercially available optical sensors and a plasma tube (not shown). For example, a plasma tube would be positioned in the buffer space and would excite contaminant gas particles, such as chlorine or fluorine ions, which are then detected by the optical sensors that are tuned to detect the excited states of those gas species. Other suitable sensing systems may also be utilized for gas sensing system 64.

Cryogenic panels 52 utilized to pump and purge contaminant gas species from buffer chamber 24 will be exposed to substantial radiated heat, and thus a substantial thermal load, from the processing chamber when the gate valve assembly 60 is opened and the substrate stage 30 is moved vertically downward from the second position to the first position after the process is completed. For example, temperatures close to 1000° C. may be used for CVD processes. Referring to FIG. 1A, a direct line of sight exists between portions of the cryogenic panels 52 and the hot substrate stage 30 and process chamber 22 when the gate valve assembly 60 is opened. To reduce the thermal load on the cryogenic panels 52, a thermal shield 66, is positioned around the walls of the buffer chamber 24 between the cryogenic panels 52 and the substrate stage 30. The thermal shield 66, which may be made of aluminum, copper, Hastelloy, or stainless steel, for example, prevents a direct line of sight between the hot substrate stage 30 and process chamber 22 and the cold cryogenic panels 52. The thermal load on the panels is thus reduced, and they will be more efficient in pumping contaminants from the buffer space 25.

A typical processing sequence utilizing the apparatus 20 of the invention is helpful in disclosing how contamination between process chamber 22 and transfer chamber 26 is reduced. First, a substrate is moved into the transfer chamber from an external location or other process chamber (not shown) by substrate transport device 27. The substrate is then ready to be processed in the process chamber 22. The gate valve assembly 60 will be closed, and isolation valve 28 is opened. The substrate is then loaded onto the substrate stage 30, as shown in FIG. 1A. The substrate transport device 27, such as a robot arm, then exits through the isolation valve 28 and the isolation valve is closed. Next, the gate valve assembly 60 is opened and the substrate stage 30 is vertically raised, as illustrated in FIG. 1B. Gate valve assembly 60 is not opened for moving the substrate 32 and a portion of stage 30 through passage 43 until the isolation valve is closed. Simultaneous with movement of the substrate stage 30, the pressure within the buffer chamber 24 is raised or lowered in order to match the pressure within the process chamber 22. If the pressure within buffer chamber 24 needs to be lowered, the vacuum pump 58 is utilized to purge the buffer chamber. The substrate stage 30 is then raised into the process position, as shown in FIG. 1B, in which the sealing structure 42 is compressed against the wall 45. Stage 30 is moved vertically by the action of the actuating mechanism 34. In that way, passage 43 is sealed to isolate the process chamber 22 from the buffer chamber 24. Next, the actuating mechanism 36 is activated to raise platen 39 and substrate 32 to a final process position, if desired. Stage 30 might not include a second actuating mechanism 36 and, therefore, the sealing position of the stage may also determine the position of the substrate with respect to the process chamber 22.

After the substrate has been positioned in the process chamber 22, the process is run. Again, the process could be a CVD process or a PVD process, or any other similar or suitable process utilized in the manufacture of integrated circuits. After the process is run, the process space 23 is initially purged, such as by vacuum pump 50. Such purging will remove a large amount of the contaminants which may migrate through the multi-chamber system. However, the buffer chamber 24, in accordance with the principles of the present invention, will further reduce contaminant species which may migrate to other process chambers. After process space 23 is purged, stage 30 is lowered, thus opening passage 43. Gate valve assembly 60 is then closed to isolate the buffer space from the process space. The cryogenic panels 52 and vacuum pump 58 are utilized to pump and purge the buffer space 25 of contaminants. The buffer space 25 has been exposed to gases from the process chamber 22, and thus those gases must be removed to reduce and prevent contamination. The buffer space is purged independently of the process space because of the closed gate valve assembly. The gas sensing system 64 is utilized to verify that the contaminant level within the process space 25 is acceptably low. If the contaminant level is low enough, isolation valve 28 is opened, and the substrate transport device 27 removes the substrate from buffer chamber 24, and moves it to additional processing chambers or completely out of the processing system.

The present invention is particularly useful for isolating a CVD processing chamber from a PVD processing chamber. The CVD processing chamber will generally be maintained at a higher pressure. Thus contaminant gas species therefrom will tend to migrate to the lower pressure PVD chamber. However, the buffer chamber 24 of the invention might also be utilized to provide an extra stage of vacuum between a PVD chamber and a transfer chamber that is not subject to an ultrahigh vacuum (UHV) similar to the PVD chamber. In such a scenario, the non-UHV transfer chamber 26 may contaminate the PVD chamber with water. Referring to FIG. 1A, if chamber 22 is a PVD chamber, water may migrate from the transfer chamber 26 into the PVD chamber 22 when a substrate is moved from the transfer chamber 26 and into the PVD chamber 22. Utilizing the buffer chamber 24, water contamination might be reduced. To that end, the vacuum pump 58 may be supplemented by a cryogenic water pump 70. Generally, not all high vacuum pumps, such as pump 58, are very efficient at removing water from an area, for example, turbo molecular or diffusion pumps. A cryogenic water pump, which is commercially available, would then be utilized in combination with the vacuum pump 58. The cryogenic water pump 70 removes water from buffer space 25 while the vacuum pump 58 removes other gas species which may contaminate the PVD process. Alternatively, instead of supplementing the vacuum pump 58 with the cryogenic water pump 70, a cryopump 72 might be utilized to replace the cryogenic water pump 70 and the vacuum pump 58. A cryopump 72, which is also commercially available, generally will operate to pump water and other species with a cooling element (not shown) cooled by the expansion of compressed helium. The cryopump 72 uses an expander head concept similar to the expander head 56 utilized with the cryogenic panels 52 discussed hereinabove, but operates at lower temperatures, typically $\leq 12$ K. Species such as hydrogen, helium, nitrogen, and argon, are pumped out by the cryopump which also sufficiently pumps water away from the buffer space 25. The cryopump may need to be regenerated more often than the vacuum pump 58/cryogenic water pump 70 scenario discussed above.

Figure 2:
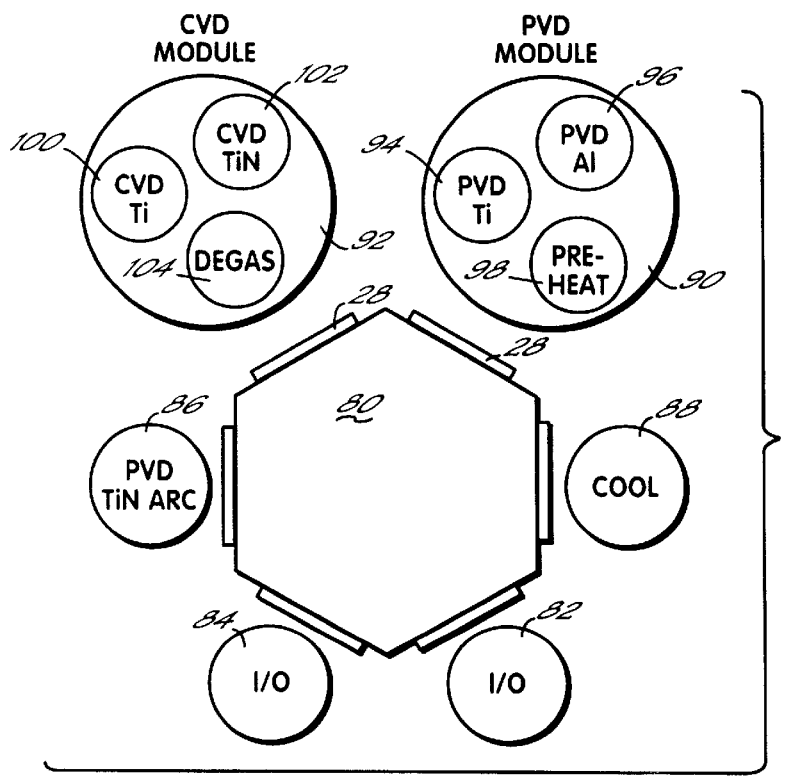
FIG. 2 is a plan view of a multiple chamber processing system utilizing a buffer chamber in accordance with the present invention.

FIGS. 1A and 1B illustrate the inventive buffer chamber of the present invention used to isolate or buffer a single process chamber 22. However, buffer chamber 24 might also be utilized to isolate several process chambers which are positioned adjacent to each other within a larger processing module. Processing systems are commercially available which utilize multiple processing chambers together in a single module where the wafer moves through the various processing chambers without leaving the module. Referring to FIG. 2, a substrate transport device or handler 80 of a processing system is shown. Handler 80 has six sides which each interface with various processing chambers for processing a substrate. Handler 80 contains a robot or other suitable device (not shown), for moving substrates between the various modules. One suitable handler 80, which may be modified to work with the present invention is the Phoenix system which has been sold in the past by Materials Research Corporation (now Tokyo Electron Arizona, Inc.). Substrates are introduced to the handler through I/O modules, such as modules 82 and 84. The handler moves the substrates between the various processing chambers according to the desired process. For example, a PVD titanium nitride anti-reflective coating might be applied through module 86. Module 88 may be utilized in a particular process for cooling substrates in between deposition steps.

Modules 90, 92 include several processing chambers thereon. Module 90 is a PVD module which includes a process chamber 94 for deposition of titanium, a process chamber 96 for deposition of aluminum, and a preheat process chamber for heating the substrates prior to deposition. CVD module 92 includes a CVD process chamber 100 for titanium deposition, a CVD process chamber 102 for titanium nitride deposition, and a degas process chamber 104. Alternatively, all the chambers in a module might perform the same process. In one embodiment of the invention, the various modules utilize an indexing mechanism 106 such as an index wheel which moves the substrates between the various processing chambers of the module (see FIG. 3). For example, one suitable device for incorporating various processing chambers into an individual module, and which might be modified for use with the present invention, is the Eclipse System which has been sold in the past by Materials Research Corporation (now Tokyo Electron Arizona, Inc.) Another suitable indexing system for moving substrates between process chambers in a module is shown in U.S. Pat. No. 4,990,047.

Figure 3:
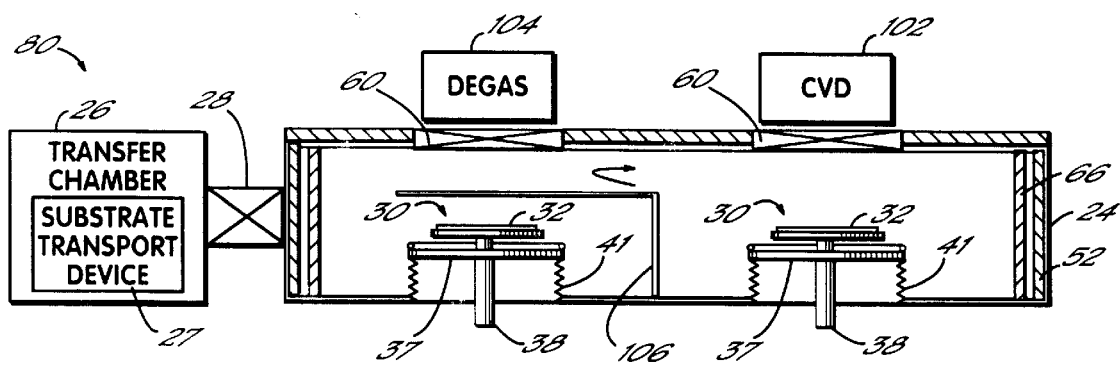
FIG. 3 is a side cross-sectional view of a CVD module of the system of FIG. 2 utilizing a buffer chamber consistent with the present invention.

FIG. 3 illustrates CVD module 92 incorporating the buffering system of the invention. Buffer chamber 24 includes substrate stage 30, as discussed above, and will interface with the process chambers of the module 92 for isolating several process steps from a transfer chamber 26 associated with substrate handler 80. One of the process chambers 104 interfacing with buffer chamber 24 might alternatively be used for a less contaminating process, such as the degas chamber 104 or even an etching chamber, a preheat chamber, like chamber 98, or a cooling chamber, like chamber 88. After the introduction of the substrates 32 from chamber 26 into buffer chamber 24, the substrates 32 will progress through the various process chambers 100, 102, 104 of the CVD module 92 using an index mechanism 106. Substrate stages 30 raise the substrates to interface with the process chambers.

Sealing mechanisms 60, such as gate valve assemblies, are opened and closed selectively, to isolate the processing chambers 100, 102, 104 from the buffer chamber 24 and transfer chamber. The substrate progresses through the various deposition stages as applicable. The index mechanism 106 moves the substrates through the buffer chamber 24. When processing is complete, the gate valve assemblies 60 are closed and the buffer chamber is purged, as discussed above, to prevent contaminants from the module 92 from migrating to PVD module 90 through the transfer chamber 26 and handler 80. In that way, a single substrate handler 80 may be utilized to support various different processes, including CVD processes and PVD processes, with reduced contamination between the various processing chambers.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. An apparatus for processing a substrate in a processing system having multiple process chambers and a common transfer chamber which is used for moving substrates between the multiple process chambers of the system, the apparatus comprising:

a process chamber having a process space therein for receiving and processing a substrate;

a buffer chamber defining a buffer space therein, the buffer chamber positioned beneath the process chamber and configured for interfacing with a transfer chamber of a processing system for receiving a substrate to be processed;

a passage formed between the process and buffer chambers for moving a substrate between the process space and buffer space;

a movable substrate stage positioned in the buffer space and configured for receiving a substrate, the substrate stage operable for moving vertically in said passage between a first position wherein the substrate is positioned in the buffer space and a second position wherein the substrate is positioned within the process space of the process chamber;

the substrate stage further operable for sealing said passage when moved to the second position to isolate the process chamber from the buffer chamber and operable for unsealing the passage when moved to the first position;

a sealing mechanism engaging the passage, the sealing mechanism operable to seal the passage and isolate the process space from the buffer space when the substrate stage is in the first position, the sealing mechanism further operable to unseal the passage so the substrate stage may be moved to the second position;

a pumping system coupled to the buffer chamber for purging the buffer space of contaminants which may leak from the process chamber to generally reduce the escape of the contaminants through the buffer chamber and into the common transfer chamber and other process chambers of a multiple chamber system.

2. The apparatus of claim 1 wherein said sealing mechanism includes a gate valve.

3. The apparatus of claim 1 wherein said pump system comprises a cryogenic panel positioned adjacent a wall of the buffer chamber, the cryogenic panel operable for capturing and thereby pumping gas from the buffer chamber to reduce contaminants in the buffer chamber.

4. The apparatus of claim 3 wherein said cryogenic panel is thermally coupled to a source of refrigerant for cooling said panel to effect pumping of the gas.

5. The apparatus of claim 3 wherein said cryogenic panel is thermally coupled to an expander head, the expander head operable for rapidly expanding a coolant gas for cooling said panel to effect pumping.

6. The apparatus of claim 3 further comprising a thermal shield positioned in the buffer chamber generally between the cryogenic panel and the passage, the thermal shield operable for absorbing radiated thermal energy associated with the process chamber and effectively shielding said cryogenic panel from said radiated energy.

7. The apparatus of claim 6 wherein said thermal shield is positioned between said cryogenic panel and the substrate stage for absorbing radiated thermal energy from the substrate stage.

8. The apparatus of claim 1 further comprising a gas sensing system operably coupled to the buffer chamber for detecting undesired gases to be removed by the pumping system from the buffer chamber.

9. The apparatus of claim 8 wherein said gas sensing system includes a plasma tube operable for exciting gas species and an optical sensor to detect the excited species.

10. The apparatus of claim 8 wherein said gas sensing system includes a residual gas analyzer.

11. The apparatus of claim 1 wherein said process and buffer chambers share a common wall, the passage being formed by an opening in the common wall.

12. The apparatus of claim 11 wherein said substrate stage includes a sealing device, the sealing device operable to compress against said wall to form an airtight seal of the passage between the process chamber and the buffer chamber when the substrate stage is moved to the second position.

13. The apparatus of claim 1 wherein said substrate stage comprises a first actuating mechanism and a second actuating mechanism movable with respect to the first actuating mechanism, the first actuating mechanism operable for moving the substrate stage to the second position to seal the passage and the second actuating mechanism operable for further moving a portion of the substrate stage to position a substrate in the process space when the substrate stage is in the second position.

14. The apparatus of claim 1 further comprising an isolation valve positioned between the transfer chamber and the buffer chamber, the isolation valve operable for closing and sealing the buffer chamber to prevent migration of contaminants from the buffer chamber into the transfer chamber.

15. The apparatus of claim 1 wherein said pumping system further includes a cryogenic pump for removing contaminants and water from the process.

16. The apparatus of claim 1 wherein said pumping system further includes a cryogenic water pump for removing water.

17. A processing system for processing a substrate using multiple fabrication processes, the system comprising:

a first process chamber for processing a substrate;

a second process chamber having a process space therein for receiving and processing a substrate;

a transfer chamber operably coupled to the first and second process chambers for transferring substrates to be processed to the first and second process chambers;

a buffer chamber having a buffer space therein, the buffer chamber positioned below the second process chamber and coupled to the transfer chamber;

a passage formed between the second process chamber and the buffer chamber to provide communication between the process space and buffer space for moving a substrate between the buffer chamber and the second process chamber;

a movable substrate stage positioned in the buffer space and configured for receiving a substrate from the transfer chamber, the substrate stage operable for moving vertically in said passage between a first position wherein the substrate is positioned in the buffer space and a second position wherein the substrate is positioned within the process space of the second process chamber;

the substrate stage further operable for sealing said passage when moved to the second position to isolate the process chamber from the buffer chamber and operable for unsealing the passage when moved to the first position;

a sealing mechanism engaging the passage, the sealing mechanism operable to seal the passage and isolate the process space from the buffer space when the substrate stage is in the first position, the sealing mechanism further operable to unseal the passage so the substrate stage may be moved to the second position;

a pumping system coupled to the buffer chamber for purging the buffer space of contaminants which may leak from the second process chamber to generally reduce the escape of the contaminants through the buffer chamber and into the common transfer chamber and the first process chamber.

18. The system of claim 17 wherein said sealing mechanism includes a gate valve.

19. The system of claim 18 wherein said pumping system comprises a cryogenic panel positioned adjacent a wall of the buffer chamber, the cryogenic panel operable capturing and thereby pumping gas from the buffer chamber to reduce contaminants in the buffer chamber.

20. The system of claim 19 further comprising a thermal shield positioned in the buffer chamber generally between the cryogenic panel and the passage, the thermal shield operable for absorbing radiated thermal energy associated with the process chamber and effectively shielding said cryogenic panel from said radiated energy.

21. The system of claim 17 further comprising a gas sensing system positioned in the buffer chamber for detecting undesired gases to be removed by the pumping system from the buffer chamber to reduce contaminants in the buffer chamber.

22. The system of claim 17 wherein said substrate stage comprises a first actuating mechanism and a second actuating mechanism movable with respect to the first actuating mechanism, the first actuating mechanism operable for moving the substrate stage to the second position to seal the passage and the second actuating mechanism operable for further moving a portion of the substrate stage to position a substrate in the process space when the substrate stage is in the second position.

23. The system of claim 17 further comprising an isolation valve positioned between the transfer chamber and the buffer chamber, the isolation valve operable for closing and sealing the buffer chamber to prevent migration of contaminants from the buffer chamber into the transfer chamber.

24. The system of claim 17 wherein said first process chamber is a physical vapor deposition chamber for performing a physical vapor deposition process and said second process chamber is a chemical vapor deposition chamber for performing a chemical vapor deposition process.

25. The system of claim 17 wherein said second process chamber is a physical vapor deposition chamber for performing a physical vapor deposition process and said first process chamber is a chemical vapor deposition chamber for performing a chemical vapor deposition process.

26. A processing system for processing a substrate using multiple fabrication processes, the system comprising:
   a process module including a first process chamber for processing a substrate and a second process chamber having a process space therein for receiving and processing a substrate;
   a buffer chamber having a buffer space therein, the buffer chamber positioned below the second process chamber, a passage formed between the second process chamber and the buffer chamber to provide communication therebetween for moving a substrate between the buffer chamber and the second process chamber;
   a transfer chamber operably coupled to the buffer chamber for transferring substrates to be processed to the buffer chamber;
   a movable substrate stage positioned in the buffer space and configured for receiving a substrate from the transfer chamber, the substrate stage operable for moving vertically in said passage between a first position wherein the substrate is positioned in the buffer space and a second position wherein the substrate is positioned within the process space of the second process chamber;
   the substrate stage further operable for sealing said passage when moved to the second position to isolate the process chamber from the buffer chamber and operable for unsealing the passage when moved to the first position;
   a sealing mechanism engaging the passage, the sealing mechanism operable to seal the passage and isolate the process space from the buffer space when the substrate stage is in the first position, the sealing mechanism further operable to unseal the passage so the substrate stage may be moved to the second position;
   a pumping system coupled to the buffer chamber for purging the buffer space of contaminants which may leak from the first and second process chambers to generally reduce the escape of the contaminants from the process module and into the transfer chamber.

27. The system of claim 26 wherein said buffer chamber is also positioned below the first process chamber with a passage formed between the first process chamber and the buffer chamber to provide communication therebetween for moving a substrate between the buffer chamber and the first process chamber; and further comprising an indexing mechanism operably communicating with the first and second process chambers for moving a substrate between the first and second process chambers.

28. The system of claim 26 wherein said pumping system comprises a cryogenic panel positioned adjacent a wall of the buffer chamber, the cryogenic panel operable capturing and thereby pumping gas from the buffer chamber to reduce contaminants in the buffer chamber.

29. The system of claim 28 further comprising a thermal shield positioned in the buffer chamber generally between the cryogenic panel and the passage, the thermal shield operable for absorbing radiated thermal energy associated with the process chamber and effectively shielding said cryogenic panel from said radiated energy.

30. The system of claim 26 further comprising a gas sensing system positioned in the buffer chamber for detecting undesired gases to be removed by the pumping system from the buffer chamber to reduce contaminants in the buffer chamber.

31. The system of claim 26 wherein said substrate stage comprises a first actuating mechanism and a second actuating mechanism movable with respect to the first actuating mechanism, the first actuating mechanism operable for moving the substrate stage to the second position to seal the passage and the second actuating mechanism operable for further moving a portion of the substrate stage to position a substrate in the process space when the substrate stage is in the second position.

32. The system of claim 26 further comprising an isolation valve positioned between the transfer chamber and the buffer chamber, the isolation valve operable for closing and sealing the buffer chamber to prevent migration of contaminants from the buffer chamber into the transfer chamber.

33. The system of claim 26 wherein said first and second process chambers of the module are a physical vapor deposition chambers for performing physical vapor deposition processes.

34. The system of claim 26 wherein said first and second process chambers of the module are chemical vapor deposition chambers for performing chemical vapor deposition processes.

35. The system of claim 26 wherein one of said first and second process chambers of the module is an etch chamber.

36. The system of claim 26 wherein one of said first and second process chambers of the module is degas chamber.

37. The system of claim 26 wherein one of said first and second process chambers of the module is a preheat chamber.

38. An apparatus for processing a substrate in a processing system having multiple process chambers and a common transfer chamber which is used for moving substrates between the multiple process chambers of the system, the apparatus comprising:
   a process chamber having a process space therein for receiving and processing a substrate;
   a buffer chamber defining a buffer space therein, the buffer chamber positioned beneath the process chamber and configured for interfacing with a transfer chamber of a processing system for receiving a substrate to be processed;
   a passage formed between the process and buffer chambers for moving a substrate between the process space and buffer space;
   a movable substrate stage positioned in the buffer space and configured for receiving a substrate, the substrate stage operable for moving vertically in said passage between a first position wherein the substrate is positioned in the buffer space and a second position wherein the substrate is positioned within the process space of the process chamber;

the substrate stage further operable for sealing said passage when moved to the second position to isolate the process chamber from the buffer chamber and operable for unsealing the passage when moved to the first position;

a sealing mechanism engaging the passage, the sealing mechanism operable to seal the passage and isolate the process space from the buffer space when the substrate stage is in the first position;

the sealing mechanism further operable to unseal the passage so the substrate stage may be moved to the second position;

a pumping system coupled to the buffer chamber for purging the buffer space of contaminants which may leak from the process chamber to generally reduce the escape of the contaminants through the buffer chamber and into the common transfer chamber and other process chambers of a multiple chamber system;

a gas sensing system operably coupled to the buffer chamber for detecting undesired gases to be removed by the pumping system from the buffer chamber, the gas sensing system.

39. The apparatus of claim 38 wherein the substrate stage is further operable for sealing said passage when moved to the second position to isolate the process chamber from the buffer chamber and is operable for unsealing the passage when moved to the first position.

40. The apparatus of claim 38 further comprising a transfer chamber operably coupled to the buffer chamber for transferring substrates to be processed to the buffer chamber, an isolation valve positioned between the transfer chamber and the buffer chamber, the isolation valve operable for closing and sealing the buffer chamber to generally prevent migration of contaminants from the buffer chamber into the transfer chamber.

41. The apparatus of claim 38 wherein said gas sensing system is operably coupled to the isolation valve to maintain the isolation valve closed for period of time while the buffer space is purged to generally prevent migration of the contaminants into the transfer chamber.

42. The apparatus of claim 38 wherein said pump system comprises a cryogenic panel positioned adjacent a wall of the buffer chamber, the cryogenic panel operable for capturing and thereby pumping gas from the buffer chamber to reduce contaminants in the buffer chamber.

43. The apparatus of claim 38 wherein said gas sensing system includes a plasma tube operable for exciting gas species and an optical sensor to detect the excited species.

44. The apparatus of claim 38 wherein said pumping system further includes a cryogenic pump for removing contaminants and water from the process.

45. The apparatus of claim 38 wherein said pumping system further includes a cryogenic water pump for removing water.

* * * * *

UNITED STATES PATENT AND TRADEMARK OFFICE
CERTIFICATE OF CORRECTION

PATENT NO.     : 6,183,564 B1
DATED          : February 12, 2001
INVENTOR(S)    : Glyn J. Reynolds and Joseph T. Hillman It is certified that error appears in the above-identified patent and that said Letters Patent is hereby corrected as shown below:

Column 8,
Line 12, delete "22", and insert -- 23 --.

Column 9,
Line 18, delete "exist", and insert -- exists --.
Line 42, delete "66,", and insert -- 66 --.

Column 10,
Line 63, delete "turbo molecular", and insert -- turbomolecular --.

Column 11,
Line 31, delete "invention", and insert -- invention, --.
Line 60, delete "Inc.)", and insert -- Inc.). --.

Column 12,
Line 29, delete "applicant", and insert -- applicants --.
Line 33, delete "details", and insert -- details, --.
Line 36, delete "applicant's", and insert -- applicants' --.

Column 14,
Line 48, delete "18", and insert -- 17 --.
Line 50, delete "operable capturing", and insert -- operable for capturing --.

Column 16,
Line 6, delete "operable capturing", and insert -- operable for capturing --.
Lines 34-35, delete "are a,", and insert -- are --.
Line 44, delete "degas", and insert -- a degas --.

Column 17,
Line 25, delete "the gas sensing system".

UNITED STATES PATENT AND TRADEMARK OFFICE
CERTIFICATE OF CORRECTION

PATENT NO. : 6,183,564 B1
DATED : February 12, 2001
INVENTOR(S) : Glyn J. Reynolds and Joseph T. Hillman It is certified that error appears in the above-identified patent and that said Letters Patent is hereby corrected as shown below:

<u>Column 18,</u>
Line 11, delete "for period", and insert -- for a period --.

Signed and Sealed this

Sixth Day of August, 2002

Attest:

JAMES E. ROGAN
*Attesting Officer*     *Director of the United States Patent and Trademark Office*